United States Patent [19]

Brunner et al.

[11] Patent Number: 5,373,233
[45] Date of Patent: Dec. 13, 1994

[54] METHOD FOR THE RECOGNITION OF TESTING ERRORS IN THE TEST OF MICROWIRINGS

[75] Inventors: Matthias Brunner, Kirchheim; Ralf Schmid, Munich, both of Germany

[73] Assignee: Siemens Aktiengesellschaft, Munich, Germany

[21] Appl. No.: 105,760

[22] Filed: Aug. 13, 1993

Related U.S. Application Data

[62] Division of Ser. No. 906,564, Jun. 29, 1992, Pat. No. 5,258,706.

[30] Foreign Application Priority Data

Oct. 16, 1991 [DE] Germany ............... 4134243

[51] Int. Cl.$^5$ .......................................... G01R 31/02
[52] U.S. Cl. ............................. 324/158.1; 324/501
[58] Field of Search ............. 324/158 R, 158 D, 71.3, 324/73.1, 501, 512, 515; 364/578; 371/23, 29.1; 250/310, 311

[56] References Cited

U.S. PATENT DOCUMENTS

| | | | |
|---|---|---|---|
| 3,784,801 | 1/1974 | Caputo et al. | 371/29.1 |
| 4,220,853 | 9/1980 | Feuerbaum et al. | 324/158 D |
| 4,417,203 | 11/1983 | Pfeiffer et al. | 324/158 R |
| 4,573,008 | 2/1986 | Lischke | 324/158 R |
| 4,578,279 | 3/1986 | Zingher | 324/501 |
| 4,733,176 | 3/1988 | Feuerbaum | 324/158 R |
| 4,761,607 | 8/1988 | Shiragasawa et al. | 371/23 |
| 4,773,174 | 3/1988 | Crosby | 324/158 R |
| 4,780,669 | 10/1988 | Brust et al. | 324/158 R |
| 4,841,242 | 6/1989 | Brunner | 324/71.3 |
| 4,843,330 | 6/1989 | Golladay et al. | 324/158 R |
| 4,943,769 | 7/1990 | Golladay et al. | 324/158 R |
| 4,985,681 | 1/1991 | Brunner et al. | 324/501 |
| 4,996,659 | 2/1991 | Yamaguchi et al. | 364/578 |
| 5,057,773 | 10/1991 | Golladay et al. | 324/158 R |

FOREIGN PATENT DOCUMENTS

| | | |
|---|---|---|
| 0189777 | 8/1986 | European Pat. Off. |
| 1946931 | 3/1971 | Germany. |
| 55-120136 | 9/1980 | Japan. |

*Primary Examiner*—Ernest F. Karlsen
*Attorney, Agent, or Firm*—Hill, Steadman & Simpson

[57] ABSTRACT

Method for the recognition of testing errors in a test of microwirings. The method for the recognition of testing errors in the test is used in particular in an electron beam test of microwirings in the form of a printed circuit board (LP) having a plurality of networks (NW1 ... NW9). Every network has a plurality of contact points (1 ... 24). Interruptions (U) in networks (NW2) and shorts (K1, K2) between networks (NW1 ... NW3) of a test group (TG1) or, respectively, shorts (K3) between networks (NW2, NW4) of different test groups (TG1, TG2), that are found in a respective main test, are confirmed in a respective follow-up test or testing errors that arose in the main test, for example due to microfields or surface contaminations, are identified.

9 Claims, 1 Drawing Sheet

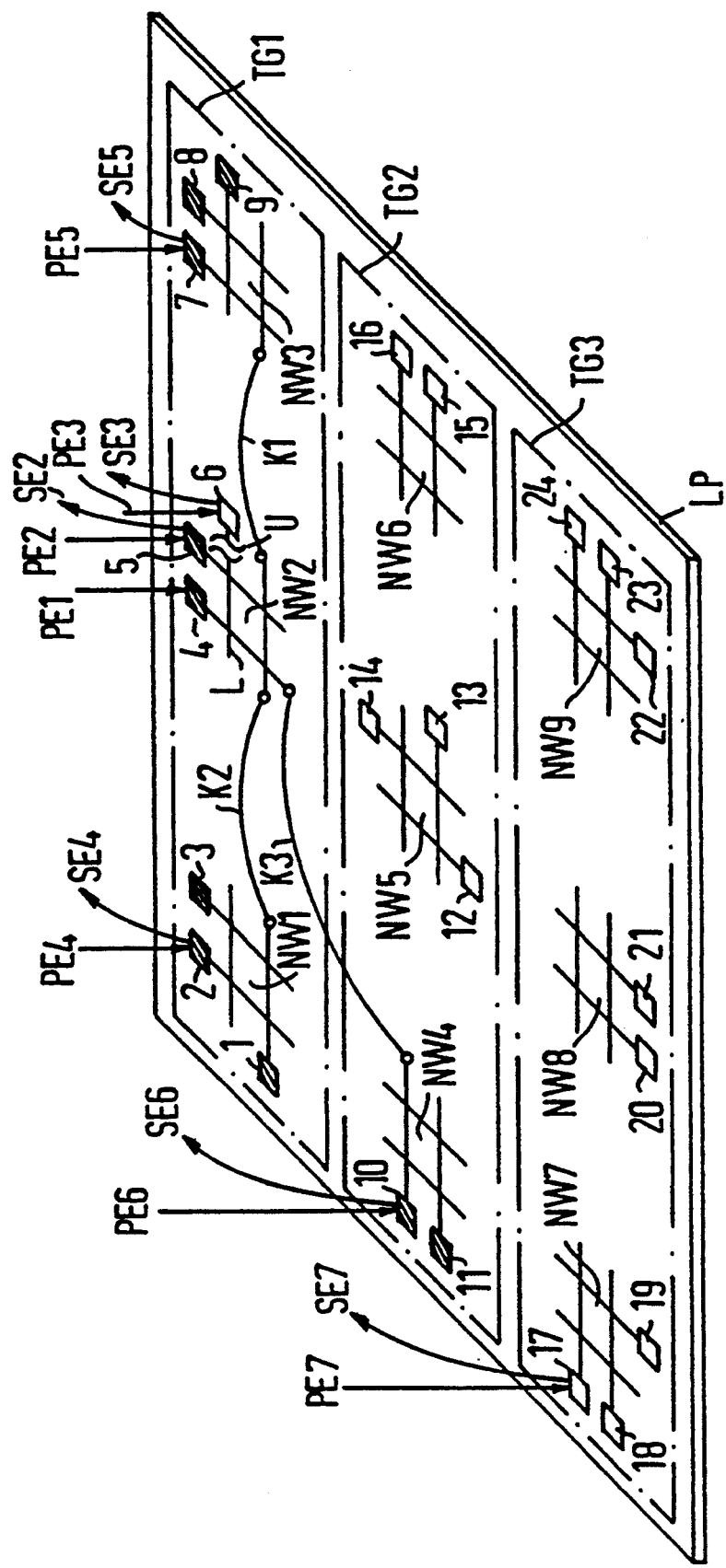

METHOD FOR THE RECOGNITION OF TESTING ERRORS IN THE TEST OF MICROWIRINGS

This is a division of application Ser. No. 906,564, filed Jun. 29, 1992, now U.S. Pat. No. 5,258,706.

BACKGROUND OF THE INVENTION

The present invention is directed to methods for recognizing testing errors in a test, particularly an electron beam test of microwirings in the form of printed circuit boards having a plurality of networks.

In the prior art European Application EP 0 189 777 B1 discloses testing methods that can supply incorrect test results, for example due to existing microfields or surface contaminations on the printed circuit board to be tested.

SUMMARY OF THE INVENTION

It is an object of the present invention to provide improved methods that enable a distinction to be made between testing errors and true errors (interruptions, shorts) of a printed circuit board by means of additional intermediate tests or follow-up tests. This object is achieved by the following methods of the present invention.

One method of the present invention involves identifying interruptions in the networks of a printed circuit board. The method is for recognizing testing errors in a test, particularly an electron beam test of microwirings in the form of a printed circuit board having a plurality of networks. Every network has a plurality of contact points, wherein interruptions in the networks are identified. All contact points have a zero potential before the beginning of a main test. A network not yet intentionally charged is respectively charged to a charging potential differing from the zero potential in a first step of the main test via a contact point of the respective network. Respective potentials of contact points not intentionally charged in the respective network are measured in a second step of the main test. An interruption in the respective network is found in a third step of the main test in that an interruption contact point of the respective network was not charged to the charging potential via a line of the respective network. This method of the present invention is a follow-up test to the main test and has the following steps. The respective interruption contact point is intentionally charged to the charging potential in a first step of the follow-up test. Potentials of contact points not intentionally charged in the follow-up test in the respective network are measured in a second step of the follow-up test. A respective interruption found in a third step of the main test is confirmed in a third step of the follow-up test when at least one contact point of the respective network was not charged to the charging potential via a line of the respective network. A testing error that arose in the main test is respectively found when the respective interruption found in the third step of the main test is not confirmed.

Another method of the present invention involves identifying shorts between networks of the printed circuit board. All contact points have a zero potential before the beginning of the main test. A respective network not yet intentionally charged is intentionally charged to a charging potential differing from the zero potential in a first step of the main test via at least one contact point of the respective network. The potentials of other networks not yet intentionally charged are measured via at least one contact point of the respective, other network in a second step of the main test. A respective short from one of the networks already intentionally charged to a respective, other network not yet intentionally charged is found in a third step of the main test in that at least one short-circuit contact point of the respective, other network not yet intentionally charged was charged to the charging potential via the respective short. This method of the present invention is a follow-up test to the main test and has the following steps. All contact points are discharged before the follow-up test. The network of the respective short-circuit contact point is intentionally charged to the charging potential in a first step of the follow-up test. Potentials of networks not yet intentionally charged in the follow-up test are identified in a second step of the follow-up test in that the potential is respectively measured via at least one contact point of the respective network not yet intentionally charged in the follow-up test. A respective short found in a third step of the main test is confirmed in a third step of the follow-up test when a network not yet intentionally charged in the follow-up test was charged to the charging potential via the respective short. A testing error that occurred in the main test is respectively found when the respective short found in a third step of the main test is not confirmed.

A further method of the present invention involves identifying both interruptions and shorts in the printed circuit board. All contact points have a zero potential before the beginning of the main test. A network respectively not yet intentionally charged is intentionally charged to a charging potential differing from the zero potential in a first Step of the main test via a contact point of the respective network. Respective potentials of contact points not intentionally charged in the respective network are measured in a second step of the main test. An interruption in the respective network is identified in a third step of the main test in that an interruption contact point of the respective network was not charged to the charging potential via a line of the respective network. The potentials of other networks not yet intentionally charged are respectively measured in a fourth step of the main test via at least one contact point of the respective, other network. A respective short from one of the networks already intentionally charged to the charging potential to a respective, other network not yet intentionally charged is identified in a fifth step of the main test in that at least one short-circuit contact point of the respective, other network not yet intentionally charged was already charged to the charging potential via the respective short. All contact points of the printed circuit board are discharged before the follow-up test. The network of the respective short-circuit contact point is intentionally charged to the charging potential via a respective short-circuit contact point in a first step of the follow-up test. Potentials of other networks not yet intentionally charged in the follow-up test are identified in a second step of the follow-up test in that the potential is respectively measured via at least one contact point of the respective, other network not yet intentionally charged in the follow-up test. A respective short found in a fifth step of the main test is confirmed in a third step of the follow-up test and a respective, other network that has not been intentionally charged and participates in the respective short is unambiguously identified and reported together with the network of the respective short-circuit contact point when the network not yet intentionally charged in the follow-up test was charged to the charging potential via the respective short. A testing error that occurred in the main test is respectively identified when the respective short identified in the fifth step of the main test is not confirmed.

In yet a further method of the present invention for identifying interruptions and shorts in the printed circuit board the majority of networks are combined to form at least one test group and the main test is respectively implemented for one test group and is supplemented by a respective intermediate test.

Networks within the respective test group that have again already discharged due to a fault are identified in the intermediate test in that the potential of at least one contact point of a respective network is respectively measured and is found whether or not the potential corresponds to the charging potential. All contact points are discharged before a follow-up test. A respective network identified in the intermediate test is intentionally charged to the charging potential in a first step of the follow-up test. Potentials of other networks of the respective test group are measured via at least one respective contact point in a second step of the follow-up test. A short is identified in a third step of the follow-up test and a respective, other network participating in the short is unambiguously identified and is reported together with the respective network intentionally charged in the first step of the follow-up test and likewise participating in the short when the network not yet intentionally charged in the follow-up test was charged to the charging potential via the short.

The respective potentials of networks of other test groups are measured via at least one contact point and of the respective network of the other test group in a first step of a respective intermediate test. A respective short that overlaps the test groups from one of the networks of the respective test group that were already intentionally charged in the respective main test to a respective network of the other test group is identified in a second step of the respective intermediate test in that at least one short-circuit contact point overlapping the test groups in the respective network of the other test group was already charged to the charging potential via the respective short overlapping the test groups.

Furthermore, all contact points of the printed circuit board are discharged as a third step of a respective intermediate test. The network of the respective short-circuit contact point that overlaps the test groups is intentionally charged to the charging potential in a first step of a follow-up test and via a short-circuit contact point that overlaps the test groups. Potentials of networks over a respective, other test group that were not yet intentionally charged in the follow-up test are identified in a second step of the follow-up test in that the respective potential is measured via at least one contact point of the respective network not yet intentionally charged in the follow-up test in the respective, other test group. A respective short that overlaps the test groups and was found in a second step of the intermediate test is confirmed in a third step of the follow-up test when a network not yet intentionally charged in the follow-up test in the respective, other test group was charged to the charging potential via the respective short that overlaps the test groups. A testing error is found when the short identified in a third step of the main test is not confirmed.

An advantage of the present invention is that more reliable test results can be achieved than in the aforementioned, prior art methods by the methods of the present invention with relatively few additional tests (intermediate test, follow-up test).

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE is a perspective view of a printed circuit board that is used in the methods of the present invention.

DESCRIPTION OF THE PREFERRED EMBODIMENT

For illustrating the methods of the present invention, the single FIGURE depicts a printed circuit board LP on whose surface are located networks NW1 . . . NW9 that are insulated from one another. The networks NW1 . . . NW3 are combined to form a test group TG1, the networks NW4 . . . NW6 are combined to form a test group TG2 and the networks NW7 . . . NW9 are combined to form a test group TG3. Each of the networks NW1 . . . NW9 has a plurality of contact points 1 . . . 24, whereby the network NW1 has the contact points 1, 2 and 3, the network NW2 has the contact points 4, 5 and 6, the network NW3 has the contact points 7, 8 and 9, the network NW4 has the contact points 10 and 11, the network NW5 has the contact points 12, 13 and 14, the network NW6 has the contact points 15 and 16, the network NW7 has the contact points 17, 18 and 19, the network NW8 has the contact points 20 and 21 and the network NW9 has the contact points 22, 23 and 24. The networks NW1 . . . NW9 are symbolically indicated by parallel pairs of lines that cross at a right angle and a line of the network is referenced L in the network NW2. The line L has an interruption U that separates the contact point 6 from the remaining network NW2. The network NW2 is connected to the network NW3 via a short K1, to the network NW1 via a short K2 and to the network NW4 via a short K3 that overlaps test groups TG1 and TG2.

For charging a network, for example, a primary electron beam is directed onto a contact point of the network. Another possibility for charging the network is, for example, by using ion irradiation, by generating photoelectrons with laser emission or by using microelectrodes. For measuring potentials at contact points, a respective primary electron beam that is usually also used for charging is directed onto the respective contact point and a secondary electron beam is thereby generated. For measuring the potentials at the contact points, the secondary electron current that proceeds into a detector is evaluated with an opposing field. Negatively charged contact points accelerate the emitted secondary electrons that can thereby overcome the opposing field. Thus, a high, detected current results therefrom as does a high signal for charged contact points, whereas a low current and, thus, a low signal results from uncharged contact points. The measurement of the potentials at the contact points can also occur, for example, via microelectrodes. By way of example, the drawing shows a primary electron beam PE1 directed onto the contact point 4 for the purpose of charging the network NW2. A primary electron beam PE2 directed onto the contact point 5 generates secondary electrons SE2; a primary electron beam PE3 directed onto the contact point 6 generates secondary electrons SE3; a primary electron beam PE5 directed onto the contact point 7 generates secondary electrons SE5; a primary electron beam PE6 directed onto the contact point 10 generates secondary electrons SE6; and a primary electron beam PE7 directed onto the contact point 17 generates secondary electrons SE7 via which the potentials of the appertaining contact points are respectively identified. When it is assumed that all contact points before a test have a potential of zero, then the first step of a main test for identifying interruptions in the networks begins in that a network that has not yet been intentionally charged, for example the network NW2, is intentionally charged to a charging potential differing from zero potential via a contact point of the respective network, for example the contact point 4. The expressions "zero potential" and "charging potential" are to be interpreted as ranges of potential, whereby the ranges of potential do not mutually overlap. In a second step of the main test for identifying interruptions in networks, potentials of contact points that are not intentionally charged in the respective network, for example the contact points 5 and 6 of the network NW2, are respectively measured. In a third step of the main test for identifying an interruption in a network, the respective interruption is identified in that an interruption contact point of the respective network has not been charged to the charging potential via a line, for example the contact point 6 via the line L of the respective network. Secondary electrons can be influenced such by microfields and/or surface contaminations such that an interruption is only simulated.

In order to avoid these testing errors, a first, inventive follow-up test is undertaken after the main test. Before a first follow-up test of the present invention, all contact points 1 ... 24 of the printed circuit board LP are thereby discharged. The discharging here and in what follows can occur by means of a low-energy, positive ion beam when the contact points had been negatively charged. In the first follow-up test of the present invention a respective interruption contact point, for example the contact point 6, is intentionally charged to the charging potential in a first step. Potentials of contact points that were not intentionally charged in this follow-up test, for example the contact points 4 or, respectively, 5 of the respective network NW2, are measured in a second step. In a third step of the first follow-up test of the present invention, the respective interrupts identified in the main test are confirmed when at least one contact point (the two contact points 4 and 5 in the single FIGURE) is not charged to the charging potential via a line of the respective network proceeding from the network of the respective interruption contact point, here the network NW2 having the interruption contact point 6. If, for example, the interruption contact point 6 had been identified in the main test and yet an interruption U was not present, then, for example, the contact points 4 and 5 would have been charged by the network NW2 to the charging potential and a testing error that occurred in the main test would have been identified.

In a test for identifying shorts between networks and given the assumption that all contact points have the zero potential before the beginning of a main test, a network, for example the network NW2, that has not yet been intentionally charged is intentionally charged to a charging potential different from the zero potential via at least one contact point, for example the contact point 4, in a first step of the main test. In the second step of the main test, respective potentials from other networks, for example the network NW3, that have not yet been intentionally charged are measured via at least one contact point, for example the contact point 7, of the other network NW3. In a third step of the main test, a respective short, for example the short K1 from one of the networks already intentionally charged, for example NW1 and NW2, to another network that has not yet been intentionally charged, for example the network NW3, is identified in that at least one short-circuit contact point, for example the contact point 7, of the other network not yet intentionally charged was already charged to the charging potential via the respective short-circuit. When measuring potentials of the contact points of a network, a charged network and, thus, a short, for example a short K1 due to the network NW3, can be likewise simulated, for example by microfields and surface contaminations.

In order to avoid these testing errors, a second follow-up test of the present invention is provided wherein the network, for example the network NW3, of the respective short-circuit contact point is intentionally charged to the charging potential via a respective short-circuit contact point, for example the contact point 7, in a first step after all contact points 1 ... 24 have been discharged. In a second step, potentials of networks, for example the networks NW1 and NW2, not yet intentionally charged in this follow-up test are identified in that the potential of the network not yet intentionally charged in the follow-up test is respectively measured via at least one contact point, for example the contact point 2 or the contact point 5. In a third step of the second follow-up test of the present invention, the respective short, for example the short K1, found in the third step of the main test is confirmed when a network, for example the network NW2, not yet intentionally charged in the follow-up test was charged to the charging potential via the respective short. Without the short K1, for example, the networks NW1 and NW2 would not have been charged in this case and the short found in the main test would have been reported as being only due to a testing error.

The tests for identifying interruptions in networks and shorts between networks can be combined in such a way that a network is respectively successively charged in order to find an interruption inside the respective network and that, subsequently, networks not yet intentionally charged are measured in order to find shorts between one of the networks already charged and the respective network. When, for example, the networks NW1 and NW2 were already intentionally charged in the main test, then, for example, the network NW3 (insofar as it is charged but was not intentionally charged) could have been charged due to a short to the network NW1 and/or a short to the network NW2. An identification of the networks participating in the respective short is thus not possible without ambiguity. The shorts K2 and K3 provided in the drawing thereby have no significance.

A main test for finding interruptions in networks and shorts between networks can be followed by a third follow-up test of the present invention wherein all contact points 1 ... 24 of the printed circuit board LP are initially discharged. In a first step the network of the respective short-circuit contact point, for example the network NW3, is intentionally charged to the charging potential via a respective short-circuit contact point, for example via the contact point 7. Potentials of other networks, for example the networks NW1 and NW2, not yet intentionally charged in the follow-up test are identified in a second step of the follow-up test in that the respective potential of the respective, other network not yet intentionally charged in the follow-up test is measured via at least one contact point, for example the contact point 2 or the contact point 5. In a third step of the third follow-up test of the present invention, a respective short, for example the short K1, found in a fifth step of the main test is confirmed and a respective, other network that has not yet been intentionally charged and participates in the respective short, for example the network NW2, is unambiguously found and reported together with the network of the respective short-circuit contact point, for example the contact point 7, when the network not intentionally charged in the follow-up test was charged to the charging potential via the respective short. An unambiguous allocation of the networks participating in the respective short is thus possible on the basis of this follow-up test even though intentionally charged networks are not respectively intentionally discharged before the intentional charging of another network but remain charged. As was already the case in the second follow-up test of the present invention, testing errors due, for example, to microfields and/or surface contaminations can be correspondingly distinguished from true printed circuit board faults such as, for example, interruptions and shorts.

Since networks already intentionally charged can have a disrupting influence on a measurement of the potential of another network and the networks (due to a limited insulatability of the printed circuit board) remain charged for only a limited time, networks to be tested must be combined to form test groups, particularly for larger printed circuit boards. Since only all networks of one test group are maximally charged at the same time, a plurality of discharging steps, for example, and additional steps for identifying shorts between test groups are required and denote additional outlay. For this reason, a test group cannot be arbitrarily small. It can occur under certain circumstances beginning with a certain size of the test group that a discharge of the network occurs before a test group is completely tested due to faults, for example due to inadequate insulation capability of the printed circuit board or charge clouds over the respective network. When it is assumed that only the short K2 is present between the networks NW1 and NW2 and the network NW1 is intentionally charged at the beginning of a main test of the test group TG1, then the network NW1 can already have been again discharged again when, for example, the potential of the network NW2 is measured for finding a short. The network NW1 can thus no longer charge the network NW2 via the short K2, as a result whereof the short K2 remains undetected in the main test. In order to avoid this testing error, an intermediate test of the present invention can be provided between the main tests and its following follow-up test after the main test for finding interruptions in networks and shorts between networks. In the intermediate test of the present invention, networks such as, for example, the network NW1 that have already again discharged are found within the respective test group TG1 in that the potential of at least one contact point of a respective network, for example the contact point 2 of the network NW1, is respectively measured and whether or not the potential corresponds to the charging potential is found. A respective follow-up test is implemented for the uncharged networks found in the intermediate test that were not suitable for finding shorts, this follow-up test being such that the third follow-up test of the present invention is implemented, whereby the networks identified in the preceding intermediate test of the present invention are subjected to this follow-up test instead of the networks having the short-circuit contact points or in addition to the networks having the short-circuit contact points. For example, the network NW1 found in the intermediate test is thus intentionally charged and the short K2 to the network NW2 is identified, even though the network NW1 was already discharged in the main test.

When a plurality of test groups are formed, then shorts can occur between networks of different test groups that overlap test groups such as, for example, the short K3 between the networks NW2 and NW4 overlapping the test groups. In a further intermediate test of the present invention, the respective potentials of networks of other test groups, for example of the networks NW4 . . . NW9 of the test groups TG2 and TG3, are measured via at least one contact point of the respective network of the other test group, for example the contact point 10 of the network NW4 of the test group TG2. In a second step of the respective, further intermediate test, a respective short overlapping test groups from one of the networks of the respective test group already intentionally charged in the respective main test to a respective network of the other test group is found in that at least one short-circuit contact point overlapping the test groups in the respective network of the other test group was already charged to the charging potential via the respective short overlapping the test groups. The short K3 that overlaps test groups, for example, is found in that, for example, at least the short-circuit contact point 10 of the network NW4 of the test group TG2 was already charged to the charging potential via the short K3 overlapping the test groups.

When at least one short-circuit contact point overlapping test groups or, respectively, one short overlapping test groups, for example the short-circuit contact point 10 and the short K3, were found in the further intermediate test of the present invention, then all contact points 1 . . . 24 of the printed circuit board can be inventively discharged as a third step of the respective intermediate test before a follow-up test of the present invention is also implemented in this case in order to potentially confirm a short or find a testing error. In this follow-up test of the present invention, the network NW2 is intentionally charged to the charging potential via, for example the short-circuit contact point 10 overlapping test groups in a first step. In a second step, potentials of networks NW1 . . . NW3 and NW7 . . . NW9 of the test groups TG1 and TG3 that have not yet been intentionally charged in the follow-up test are found in that the respective potential is measured via at least one contact point 2, 4, 7, 17, 20 and 22. In a third step, a respective short K3 overlapping test groups and found in a second step of the further intermediate test of the present invention is confirmed when a network of the respective, other test group, for example the network NW2 of the test group TG1, that was not yet intentionally charged in the follow-up test was charged to the charging potential via the respective short K3 that overlaps the test groups. If the short K3 that overlaps the test groups is not confirmed in the follow-up test of the present invention, a testing error is present.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for the recognition of testing errors in a test, particularly an electron beam test of microwirings in the form of a printed circuit board having a plurality of networks, each network of the plurality of networks having a plurality of contact points, wherein interruptions in networks and shorts between networks are identified, comprising the steps of:

providing all contact points with a reference potential before a beginning of a main test;

charging a respective network not yet intentionally charged to a charging potential differing from the reference potential in a first step of the main test via a contact point of the respective network;

measuring respective potentials of contact points not intentionally charged in the respective network in a second step of the main test;

identifying an interruption in the respective network in a third step of the main test in that an interruption contact point of the respective network is not charged to the charging potential via a line of the respective network;

measuring potentials of at least one other network not yet intentionally charged in a fourth step of the main test via at least one contact point of the respective, other network;

identifying a respective short from the at least one respective network already intentionally charged to the charging potential to a respective, at least one other network not yet intentionally charged in a fifth step of the main test in that at least one short-circuit contact point of the respective, other network not yet intentionally charged is already charged to the charging potential via the respective short;

discharging all contact points of the printed circuit board before a follow-up test;

intentionally charging the network of the respective short-circuit contact point to the charging potential via the respective short-circuit contact point in a first step of the follow-up test;

identifying potentials of other networks not yet intentionally charged in the follow-up test in a second step of the follow-up test in that the potential is respectively measured via at least one contact point of the respective, other network not yet intentionally charged in the follow-up test;

confirming a respective short found in a fifth step of the main test in a third step of the follow-up test and a respective, other network that has not been intentionally charged and that participates in the respective short is unambiguously identified and reported together with the network of the respective short-circuit contact point if the network not yet intentionally charged in the follow-up test is charged to the charging potential via the respective short; and identifying a testing error that occurred in the main test when the respective short identified in the fifth step of the main test is not confirmed.

2. A method for the recognition of testing errors in a test, particularly an electron beam test of microwirings in the form of a printed circuit board having a plurality of networks, each network of the plurality of networks having a plurality of contact points, wherein interruptions in networks and shorts between networks are identified, comprising the steps of:

providing all contact points with a reference potential before a beginning of a main test;

intentionally charging a network respectively not yet intentionally charged to a charging potential differing from the reference potential in a first step of the main test via a contact point of the respective network;

measuring respective potentials of contact points not intentionally charged in the respective network in a second step of the main test;

identifying an interruption in the respective network in a third step of the main test in that an interruption contact point of the respective network is not charged to the charging potential via a line of the respective network;

measuring potentials of at least one other network not yet intentionally charged in a fourth step of the main test via at least one contact point of the respective, other network;

identifying a respective short from at least the respective network already intentionally charged to the charging potential to a respective, other network not yet intentionally charged in a fifth step of the main test in that at least one short-circuit contact point of the respective, other network not yet intentionally charged is already charged to the charging potential via the respective short;

combining a majority of networks of the plurality of networks to form at least one test group; and implementing the main test for the test group and supplementing the main test with an intermediate test for the test group.

3. The method according to claim 2, wherein networks within the respective test group that have discharged after the main test due to a fault are identified in the intermediate test in that the potential of at least one contact point of a respective network is respectively measured and is identified as to whether or not the potential corresponds to the charging potential; and wherein the method further comprises the steps of: discharging all contact points before a follow-up test; intentionally charging a respective network identified in the intermediate test to the charging potential in a first step of the follow-up test; measuring potentials of at lest one other network of the respective test group via at least one respective contact point in a second step of the follow-up test; and identifying a short in a third step of the follow-up test and unambiguously identifying a respective, other network participating in the short the respective, other network being reported together with the respective network intentionally charged in the first step of the follow-up test and also participating in the short, if the network not yet intentionally charged in the follow-up test is charged to the charging potential via the short.

4. The method according to claim 2, wherein a plurality of test groups are formed and wherein the method further comprises the steps of: measuring respective potentials of networks of other test groups via at least one contact point of a respective network of the other test group in a first step of a respective intermediate test; identifying a respective Short that overlaps the test groups from one of the networks of the respective test group that were already intentionally charged in the respective main test to a respective network of the other test group in a second step of the respective intermediate test in that at least one short-circuit contact point overlapping the test groups in the respective network of the other test group is already charged to the charging potential via the respective short overlapping the test groups.

5. The method according to claim 4, wherein all contact points of the printed circuit board are discharged as third step of a respective intermediate test, and wherein the method further comprises the steps of: intentionally charging the network of the respective short-circuit contact point that overlaps the test groups to the charging potential in a first step of a follow-up test and via a short-circuit contact point that overlaps the test groups; identifying potentials of networks over a respective, other test group that were not yet intentionally charged in the follow-up test in a second step of the follow-up test in that the respective potential is measured via at least one contact point of the respective network not yet intentionally charged in the follow-up test in the respective, other test group; confirming a respective short that overlaps the test groups and that was identified in the second step of the intermediate test in a third step of the follow-up test, if a network not yet intentionally charged in the follow-up test in the respective, other test group is charged to the charging potential via the respective short that overlaps the test groups; and identifying a testing error when the short identified in a third step of the main test is not confirmed.

6. The method according to claim 1, wherein the reference potential is substantially a zero potential.

7. The method according to claim 2, wherein the reference potential is substantially a zero potential.

8. The method according to claim 1, wherein the reference potential is a potential in a range of reference potentials and the charging potential is a potential in a range of charging potentials.

9. The method according to claim 2, wherein the reference potential is a potential in a range of reference potentials and the charging potential is a potential in a range of charging potentials.

* * * * *